United States Patent
Park et al.

(10) Patent No.: US 7,308,639 B2
(45) Date of Patent: Dec. 11, 2007

(54) METHOD OF RECORDING/REPRODUCING DATA ON STORAGE MEDIUM

(75) Inventors: Hyun-jeong Park, Suwon-si (KR); Joo-seon Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 381 days.

(21) Appl. No.: 10/992,699

(22) Filed: Nov. 22, 2004

(65) Prior Publication Data

US 2005/0160344 A1    Jul. 21, 2005

(30) Foreign Application Priority Data

Dec. 30, 2003    (KR) .................. 10-2003-0100630

(51) Int. Cl.
*H11C 29/00*    (2006.01)
(52) U.S. Cl. .............. 714/763; 714/755; 714/764; 714/799
(58) Field of Classification Search ............. 714/763, 714/755, 764, 799, 48, 703, 53
See application file for complete search history.

(56) References Cited

U.S. PATENT DOCUMENTS

| | | | | |
|---|---|---|---|---|
| 5,682,360 | A | * | 10/1997 | Oshima .................. 369/13.2 |
| 6,130,988 | A | * | 10/2000 | Jeong ..................... 386/125 |
| 7,127,657 | B2 | * | 10/2006 | Watanabe et al. ......... 714/755 |
| 2002/0133779 | A1 | * | 9/2002 | Shieh .................... 714/755 |

* cited by examiner

*Primary Examiner*—Guy Lamarre
*Assistant Examiner*—Fritz Alphonse
(74) *Attorney, Agent, or Firm*—Stein, McEwen & Bui, LLP (57) ABSTRACT

A method of recording/reproducing data on a storage medium. The method includes decoding a radio frequency (RF) signal read from the storage medium into corresponding binary data; storing the binary data in an external memory connected with a host interface through which a host inputs an instruction to read data from the storage medium; and storing data read from the external memory in an internal memory and performing ECC error correction on the data, wherein the internal memory is directly connected to an ECC unit that performs ECC error correction and has a data storage capacity of one ECC block.

23 Claims, 8 Drawing Sheets

METHOD OF RECORDING/REPRODUCING DATA ON STORAGE MEDIUM

CROSS-REFERENCE TO RELATED APPLICATIONS

This application claims the benefit of Korean Patent Application No. 2003-100630 filed Dec. 30, 2003, in the Korean Intellectual Property Office, the disclosure of which is incorporated herein by reference.

BACKGROUND OF THE INVENTION

1. Field of the Invention

The present invention relates to a method of recording/reproducing data on/from a storage medium, and more particularly, to a method of recording/reproducing data on/from a storage medium, which reduces a chip size of a recording/reproducing apparatus by reducing a memory capacity for error correction and data transmission to the storage medium or to a host.

2. Description of the Related Art

Optical discs are commonly used as large capacity storage media, which accommodate a large amount of user data, are convenient to use, and are highly durable.

Figure 1:
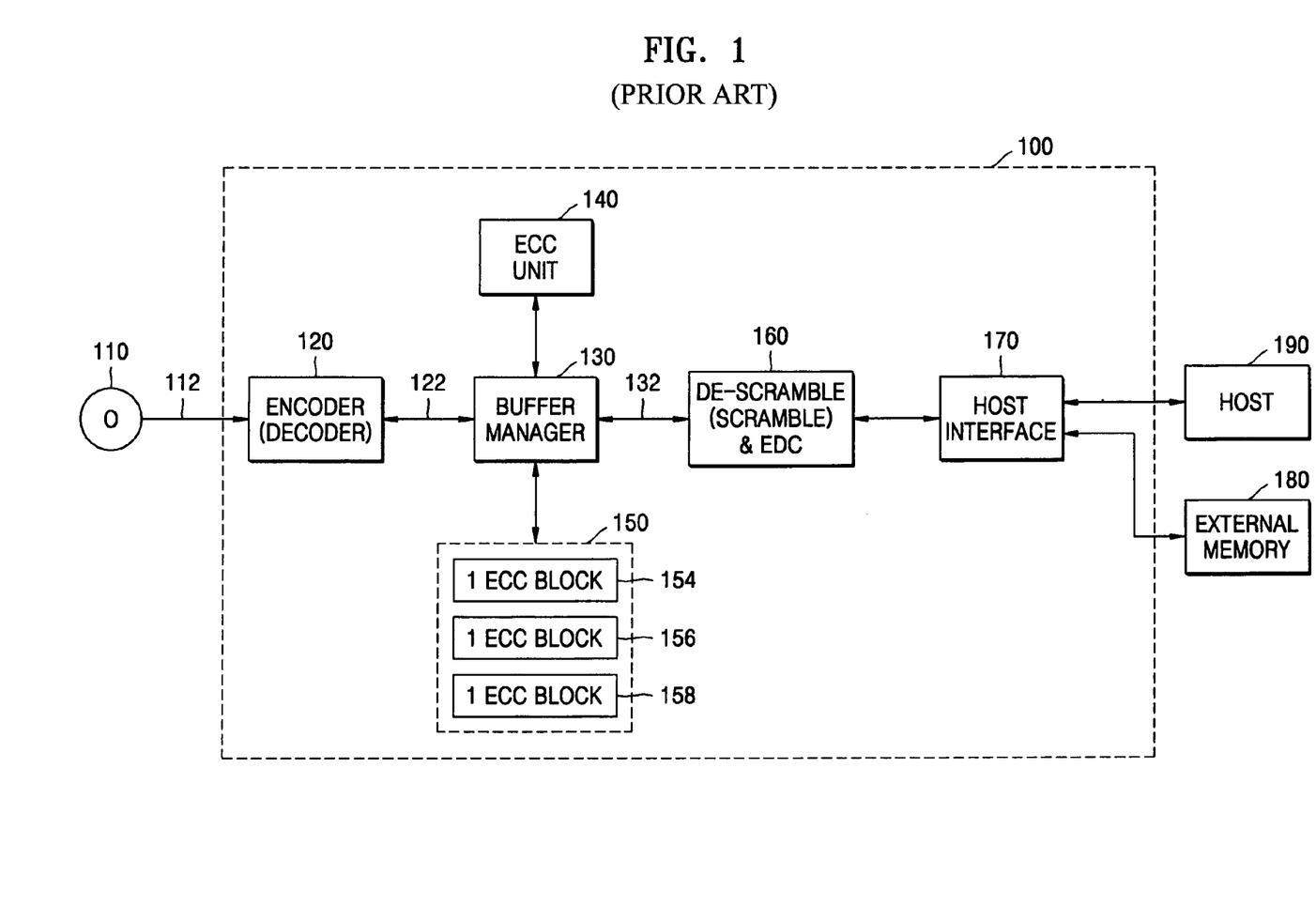
FIG. 1 is a block diagram of a conventional recording/reproducing apparatus.

FIG. 1 is a block diagram of a conventional recording/reproducing apparatus. Referring to FIG. 1, the recording/reproducing apparatus includes an encoder/decoder 120 that encodes data received from a host 190 or decodes data read from a storage medium 110 according to a predetermined method, an internal memory 150 that temporarily stores enoded/decoded data, a buffer manager 130 that manages the buffering of data between the internal memory 150 and a part which requires that data from the internal memory 150, an error correction code (ECC) unit 140 that performs (ECC) error correction on decoded data using parity information or generates parity information of data received from the host, a de-scramble/scramble and error-corrected data or scrambles and inserts an EDC into data received from the host 190, a host interface 170 that communicates with the host 190, and an external memory 180 that temporarily stores data to be transmitted to the host 190.

Of the above components, the encoder/decoder 120, the buffer manager 130, the de-scramble/scramble and EDC unit 160, the host interface 170, the ECC unit 140, and the internal memory 150, together are generally integrated into a single chip.

A conventional method of reproducing data from the storage medium 110 shown in FIG. 1 will now be described.

A signal read from the storage medium 110 is decoded by the decoder 120 into corresponding binary data 122. The buffer manager 130 temporarily stores the binary data 122 received from the decoder 120 in the internal memory 150. The internal memory 150 is divided into three sections: a first section 154 for storing all data from the decoder 120, a second section 156 for performing error correction on the data from the first section 154 by communicating with the ECC unit 140, and a third section 158 for storing resulting error corrected data to be transmitted to the de-scramble/scramble and EDC unit 160.

The buffer manager 130 sequentially stores data from the decoder 120 in the internal memory 150. If data stored in the internal memory 150 surpasses one ECC block, the buffer manager 130 sends one ECC block of data to the ECC unit 140. While the buffer manager 130 does this, data is continuously input to the buffer manager 130 and the buffer manager 130 continuously stores the data in the first section 154 of the internal memory 150.

The ECC unit 140 performs ECC correction on the data stored in the second section 156 by communicating with the second section 156 of the internal memory 150 via the buffer manager 130. After the ECC correction, the buffer manager 130 stores error corrected data in the third section 158 of the internal memory 150. The error corrected data stored in the third section 158 of the internal memory 150 is sent to the de-scramble/scramble and EDC unit 160 to be de-scrambled and EDC-checked. After de-scrambling and EDC checking of the error corrected data, resulting data is sent and stored in the external memory 180 through the host interface 170, and also is sent to the host 190.

A method of recording data on the storage medium 110 operates inversely of the reproducing method described above. In the method of recording data on the storage medium 110, the encoder/decoder 120 encodes data provided by the buffer manager 130 and records the encoded data on the storage medium 110, and the de-scramble/scramble data to the buffer manager 130.

In the conventional recording and reproducing method, the internal memory requires 3 sections because the ECC unit 140 exclusively uses one ECC block of memory, and thus further sections to store the data 122 received from the decoder and the data to be transmitted to the de-scramble and EDC unit 160 are needed. Most parts of the reproducing/recording apparatus 100 (the parts enclosed by a dashed rectangle in FIG. 1) are integrated into a single chip referred to as a system-on-chip. Here, a large capacity of internal memory may enlarge a size of the chip. If the chip is too large, various problems in designing and producing chips, e.g., reduced yield and extended testing time, may result.

SUMMARY OF THE INVENTION

The present invention provides a method of recording/reproducing data on a storage medium, according to which a required capacity of an internal memory is reduced, thereby also reducing a chip size of a recording/reproducing apparatus.

According to an aspect of the present invention, there is provided a method of reproducing data from a storage medium, the method comprising: decoding a radio frequency (RF) signal read from the storage medium into corresponding binary data; storing the binary data in an external memory connected with a host interface through which a host inputs an instruction to read data from the storage medium; and storing data read from the external memory in an internal memory and performing ECC error correction on the data, wherein the internal memory is directly connected to an ECC unit that performs ECC error correction and has a data storage capacity of one ECC block.

According to an aspect of the present invention, the method further comprises, performing de-scrambling and EDC checking on the ECC error corrected data.

According to an aspect of the present invention, the method further comprises, storing the de-scrambled and EDC check data in the external memory.

According to an aspect of the present invention, performing ECC error correction on the data comprises updating the internal memory with the ECC error corrected data; and receiving a new ECC block of data from the external memory and storing the new ECC block of data in the internal memory, wherein the updating and storing are performed simultaneously during a first inner parity (PI) correction period.

According to an aspect of the present invention, storing data read from the external memory in the internal memory comprises converting a format of the data read from the external memory to be compatible with the internal memory.

According to an aspect of the present invention, storing data read from the external memory in an internal memory comprises interleaving each outer parity (PO) generated in each sector of the data before storing the data in the internal memory.

According to another aspect of the present invention, there is provided a method of recording data on a storage medium, the method comprises: storing data received from a host in an external memory via a host interface, in response to an instruction from the host to record the data on the storage medium; reading out data stored in the external memory and scrambling and inserting EDC information into the data; and storing the scrambled and EDC inserted data in an internal memory and inserting parity information into the data for ECC error correction, wherein the internal memory has a data storage capacity of one ECC block.

According to an aspect of the present invention, inserting the parity information comprises: generating a first inner parity (PI); and generating a first outer parity (PO).

According to an aspect of the present invention, generating a first PI comprises: updating the internal memory with PI-inserted data; and receiving new data from the external memory and storing it in the internal memory, wherein the updating and storing are performed simultaneously while the first PI is generated.

According to an aspect of the present invention, the method further comprises, storing data read from the internal memory in the external memory, and then recording the data on the storage medium.

According to an aspect of the present invention, storing data read from the internal memory in the external memory comprises converting a format of the data read from the internal memory to be compatible with the external memory, and storing data read from the external memory in the internal memory comprises converting a format of the data read from the external memory to be compatible with the internal memory.

According to an aspect of the present invention, storing data read from the internal memory in the external memory comprises interleaving each outer parity (PO) generated in each sector of the data before storing the data into the external memory, and storing data read from the external memory in the internal memory comprises de-interleaving each outer parity generated in each sector of the data before storing the data into the external memory.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 2:
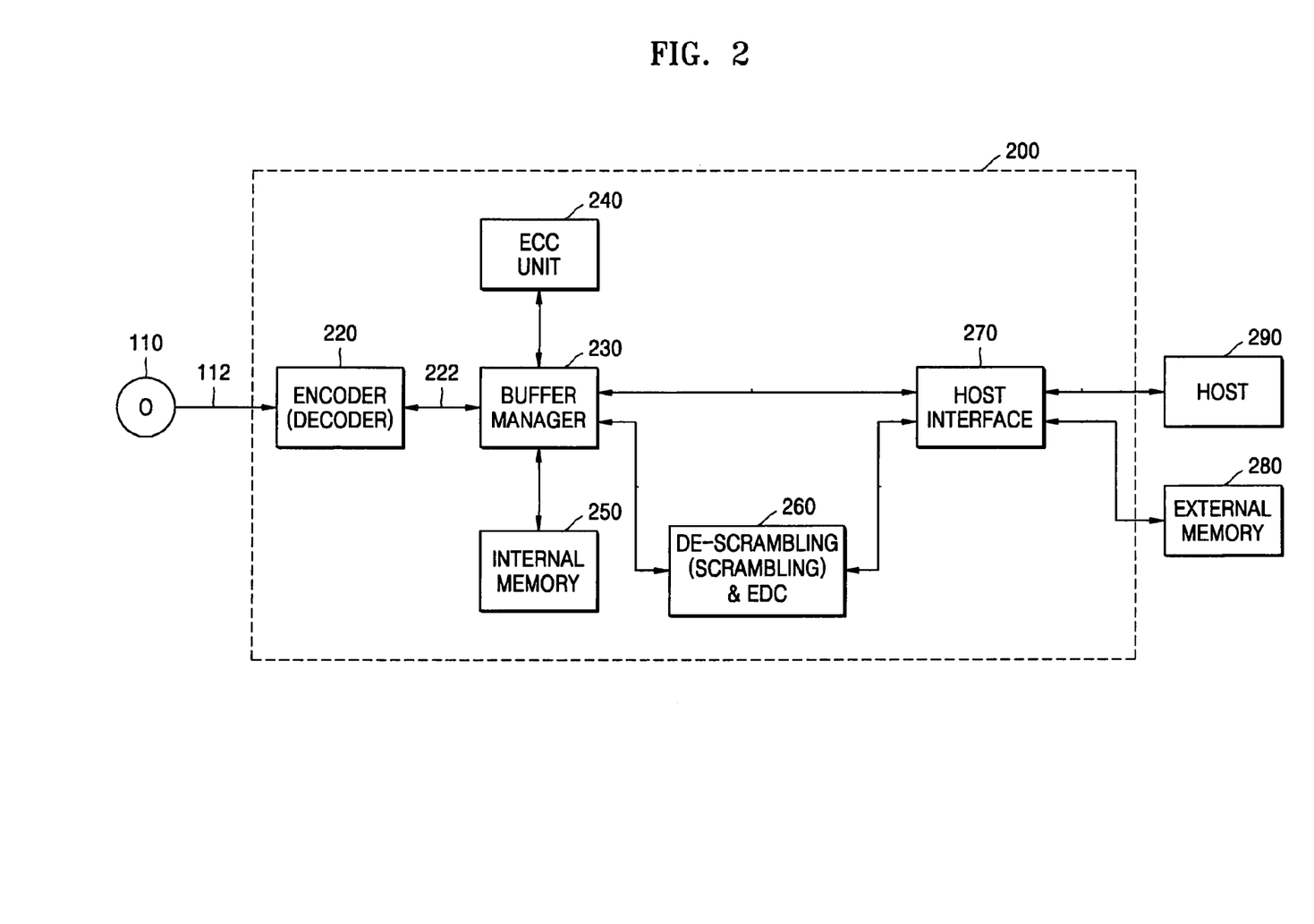
FIG. 2 is a block diagram of an embodiment of a recording/reproducing apparatus according to an example embodiment of the present invention.

FIG. 2 is a block diagram of an embodiment of an apparatus 200 for recording/reproducing data on a storage medium, according to the present invention.

Referring to FIG. 2, the apparatus 200 is identical in structure to the conventional recording/reproducing apparatus 100 shown in FIG. 1, except that an internal memory 250 has a capacity of only one ECC block, and a host interface 270 is directly connected to a buffer manager 230. Thus, encoder/decoder 220, ECC unit 240, de-scrambling/scrambling & EDC 260, host 290 and external memory 280 are structurally identical to the encoder/decoder 120, ECC unit 140, de-scrambling/scrambling & EDC 160, host 190 and external memory 180, respectively, as described above with respect to FIG. 1.

In embodiment shown in FIG. 2, the internal memory 250 is used exclusively for error correction by an ECC unit 240. Data read from the decoder 220 and data to be transmitted to the host 290 are stored in the external memory 280.

Data 222 read from the decoder 220 is first stored in the external memory 280, via the host interface 20 directly connected to the buffer manager 230, and then is sent by the buffer manager 230 to the ECC unit 240 for error correction.

In a recording method according to the present invention, which will be described below with reference to FIG. 6, data from the host 290 is sent to the buffer manager 230 via the host interface 270, stored for a while in the buffer manager 230 to be subjected to scrambling and EDC checking, and then sent to the ECC unit 240 for generating ECC parity information. In the recording apparatus, the internal memory 250 is also used exclusively for error correction.

Figure 3:
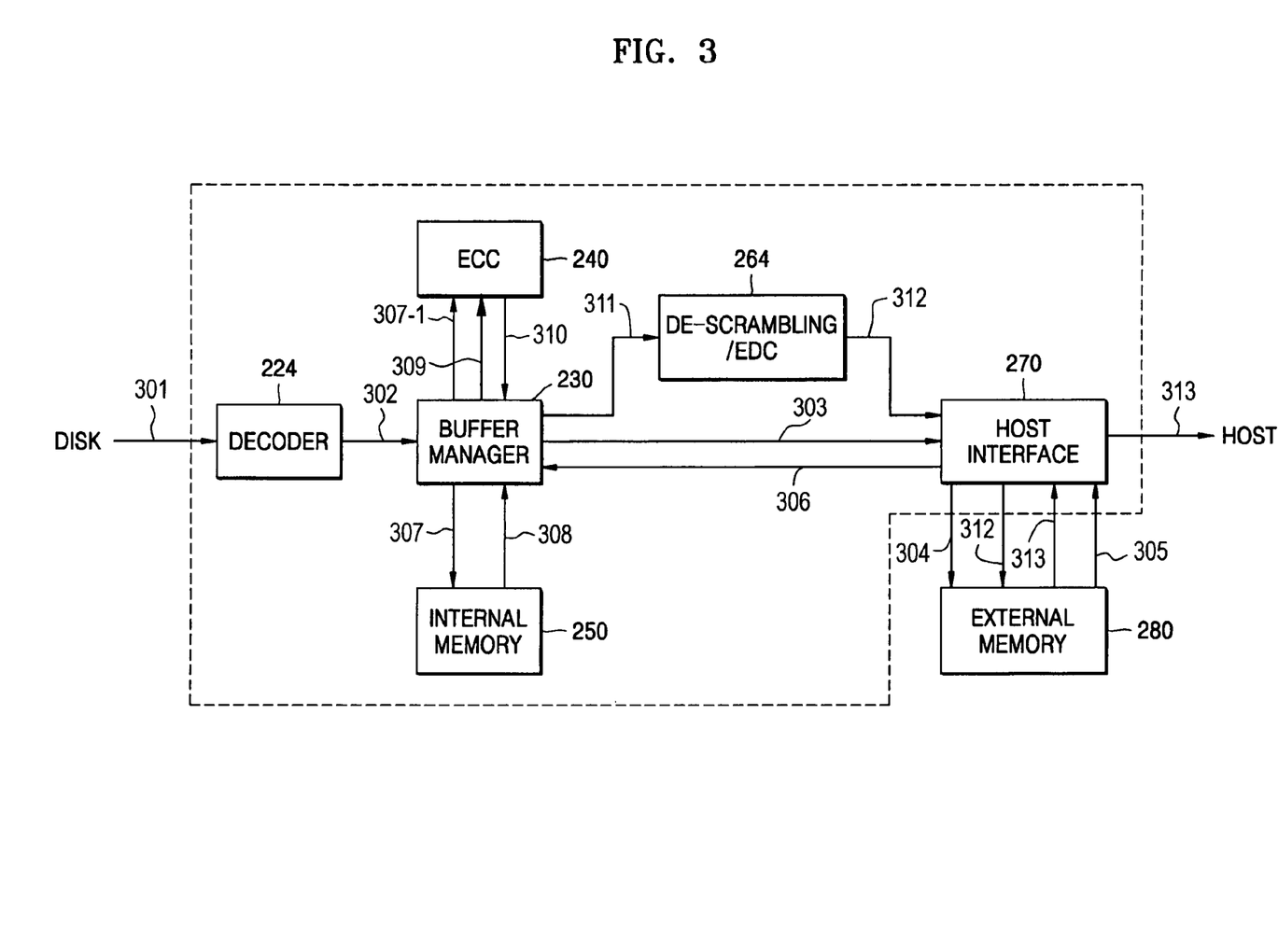
FIG. 3 is a block diagram illustrating a reproducing method according to an example embodiment of the present invention.

FIG. 3 is a block diagram illustrating a method of reproducing data from a storage medium, according to the present invention, in which the sequential flow of data is represented by arrows and associated reference characters.

Referring to FIG. 3, first, a radio frequency (RF) signal is read from the storage medium 110 in operation 301. The signal read from the storage medium 110 is decoded into binary data by the decoder 224, and the binary data is forwarded to the buffer manager 230 in operation 302. The buffer manager 230 sends the binary data to the external memory 280 via the host interface 270 in operations 303 and 304. All the binary data output by the decoder 224 is sequentially stored in the external memory 280 without being modified through operations 2, 3 and 4.

After that the data is stored in the external memory 280, the buffer manager 230 reads out only one ECC block of data from the external memory 280 via the host interface 270 in operations 305 and 306. The buffer manager 230 sends the one ECC block of data to be stored in the internal memory 250 in operation 307. While the buffer manager 230 performs operations 305, 306 and 307, data is continuously transmitted from the decoder 224 to the external memory. In addition, when the buffer manager 230 buffers the one ECC block of data from the external memory 280 into the internal memory 250, the buffer manager 230 also buffers the one ECC block of data to the ECC unit 240 in operation 307-1 in order to shorten data process time using an on-the-fly operation that will be described below.

The ECC unit 240 performs error correction on the one ECC block of data directly sent from the buffer manager 230. Since the error correction is performed on the one ECC block of data by the ECC unit 240 in stages, the ECC unit 240 repeatedly accesses the internal memory 250 to update data stored in the internal memory 250. Such data transmission between the internal memory 260 and the ECC unit 240 is managed by the buffer manager 230 in operations 308, 309 and 310. Final error corrected data is stored in the internal memory 250.

The final error corrected data stored in the internal memory 250 is sent to the de-scrambling/EDC unit 264 in operation 311. The de-scrambling and EDC unit 264 performs de-scrambling on the error corrected data, and then performs EDC checking on the result of de-scrambling, to ensure that the decoded data is completely recovered.

After the de-scrambling and EDC checking is performed, resulting data is stored in the external memory 280 via the host interface 270 in operation 312, and afterwards, the data is transmitted from the external emory 280 to a host 290, as shown in FIG. 2, via the host interface 270 in operations 313.

According to the method of reproducing data from the storage medium described with respect to FIG. 3, the internal memory 250 always holds only one ECC block of data for error correction. All the data output from the decoder 224 is stored in the external memory 280 first, and then stored in the internal memory 250. Since the error correction is performed by the ECC unit 240 after the one ECC block of data is sent from the external memory 280 to the internal memory 250, the internal memory is only required to accommodate one ECC block of data.

Another feature of the present invention is that the buffer manager 230 simultaneously buffers data sent from the external memory 280 via the host interface 270 both to the ECC unit 240 and to the internal memory 250. An operational principle of the buffer manager 230 will now be described with reference to FIG. 4.

Figure 4:
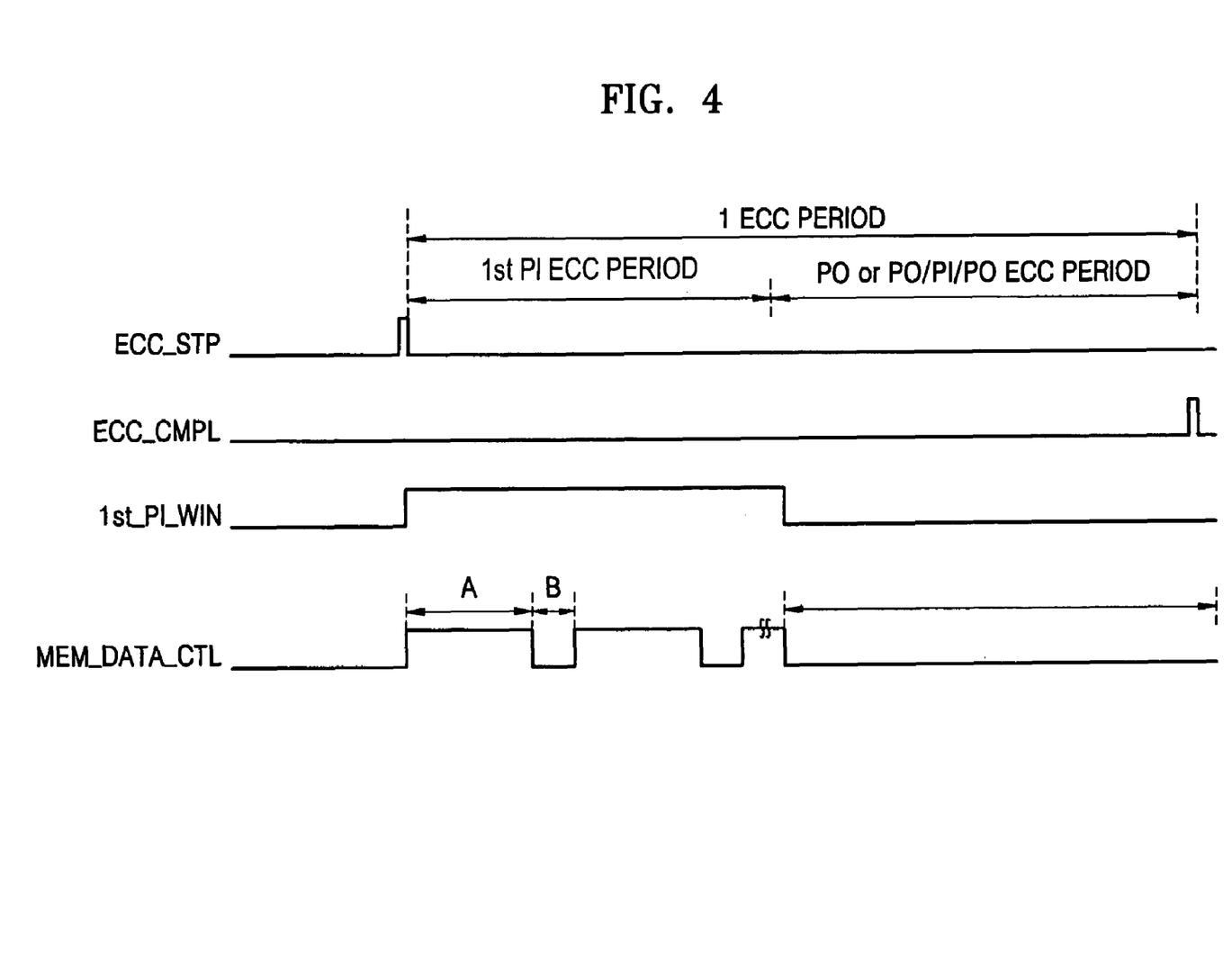
FIG. 4 is a timing chart showing signals to govern on-the-fly operations of a buffer manager according to an example embodiment of the present invention.

FIG. 4 is a timing chart showing signals generated by the ECC unit 240 that govern on-the-fly operations of the buffer manager 230.

Referring to FIG. 4, ECC_STP is an ECC start pulse, ECC_CMPL is a ECC end pulse, 1st_PI_WIN is a first PI correction window pulse, and MEM_DATA_CTL is a memory data control pulse. These 4 pulses are generated by the ECC unit 240, and the buffer manager 230 controls the flow of data according to the 4 pulses.

An interval between the ECC start pulse and the ECC end pulse is a unit of the time taken to perform error correction on the one ECC block of data. For a general storage medium, the ECC error correction process includes an inner parity correction process and an outer parity correction process. Also, the inner parity correction process and the outer parity correction process may be repeated according to a type of the storage medium. For example, for a DVD, the inner and outer parity correction processes are repeated up to 2 times. That is, in the error correction mode for a DVD, any one of inner parity (PI) correction, inner parity/outer parity (PI/PO) correction, or PI/PO/PI/PO correction may be performed.

The duration of the 1st_PI_WIN is the time taken to perform a 1st PI correction. Thus, during the 1st PI pulse, error correction and data update are performed on a codeword.

The MEM_DATA_CTL appears in the duration of the 1st_PI_WIN for performing the 1st PI correction. The MEM_DATA_CTL is used to control the buffer manager 230 to distinguish data transmission timing among the external memory 280, the internal memory 250, and the ECC unit 240. An interval "A" shown in FIG. 4 is an interval of data transmission among the external memory 280, the internal memory 250, and the ECC unit 240. An interval "B" shown in FIG. 4 is an interval of data transmission between only the internal memory 250 and the ECC unit 240.

During the interval A, the buffer manager 230 sends all the PI codewords to the internal memory 250 and the ECC unit 240 at the same time. During the interval B, the buffer manager 230 stops sending data received from the external memory 280 to the internal memory 250, and updates the internal memory 250 with data resulting from error correction by the ECC unit 240. According to a DVD specification, the first PI correction may be performed on a maximum of 5 bytes of data. Thus, a length of the interval B extends up to 5 bytes. The combined length of intervals A and B indicates a time taken to store and update a single codeword.

Figure 5A:
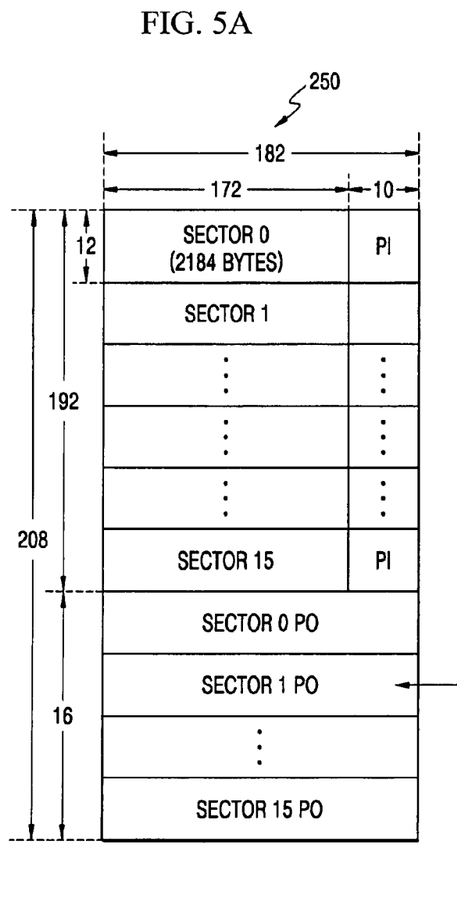
FIG. 5A shows a data format of an internal memory according to an example embodiment of the present invention.
Figure 5B:
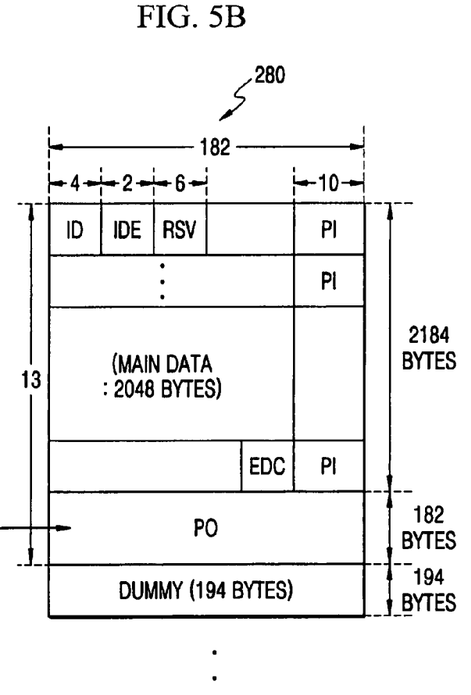
FIG. 5B shows a data format of an external memory according to an example embodiment of the present invention.

FIG. 5 shows a data format of the external memory 280 and a data format of the internal memory 250.

Referring to FIG. 5, the interval memory 250 stores only one ECC block of data, the format of which is compatible with the ECC error correction. Data stored in the external memory 280 has the same format as data output directly from the decoder 224. In the conventional reproducing method, data stored in the external memory 280 is only sent to host 280. However, in the present reproducing method, data stored in the external memory 280 is also sent to the interval memory 250 for error correction, so that the format of the data should be modified to be compatible with the error correction. Such format conversion is performed by the host interface 270.

As shown in FIG. 5A, the internal memory 250 includes one ECC block of data comprising 208 codewords. Each codeword is 182 bytes long. Among the 208 codewords, 192 codewords include 10 bytes of PI each, and a PO is generated for every 12 of the 192 codewords. The 12 codewords for which a PO is generated constitutes a sector. The POs generated every 12 codewords are sequentially stored in a last part of the ECC block in a space allocated for 16 code words, with one codeword allocated for each PO.

As shown in FIG. 5B, an external memory 280 stores, for example, DVD formatted data. Since the data has just been decoded after being read from a storage medium 110, read data is stored in each sector of the external memory 280.

As shown in FIG. 5B, data stored in the external memory 280 includes 13 codewords. Among the 13 codewords, 12 codewords contain PI and a remaining codeword has a PO of 10 bytes generated with respect to the 12 codewords. In a message data part, there are an ID of 4 bytes, an IDE of 2 bytes, and an RSV of 6 bytes included in a header, which are defined by the DVD format, and a last portion of the message data part contains EDC data for EDC checking.

When data is stored in the external memory 280 by the buffer manager 230, in operations 303 and 304 as shown in FIG. 3, the host interface 270 converts the format of the data, shown in FIG. 5A into the format shown in FIG. 5B. During the conversion process, a respective PO formatted to be compatible with the internal memory 250 is interleaved with the data of the 12 codewords to which the respective PO pertains and then stored in a sector of the external memory 280 with a format compatible with the external memory 280.

Conversely, when the buffer manager 230 manages data stored in the external memory 280 to be stored into the internal memory 250, in operations 305, 306 and 307 of FIG. 3, the host interface 270 converts the format of data shown in FIG. 5B, into the format shown in FIG. 5A. During the latter conversion process, the PO stored in a sector of the external memory 280, with a format compatible with the external memory 280, is de-interleaved and then stored in a lower part of the one ECC block in the format of the internal memory 250.

Figure 6:
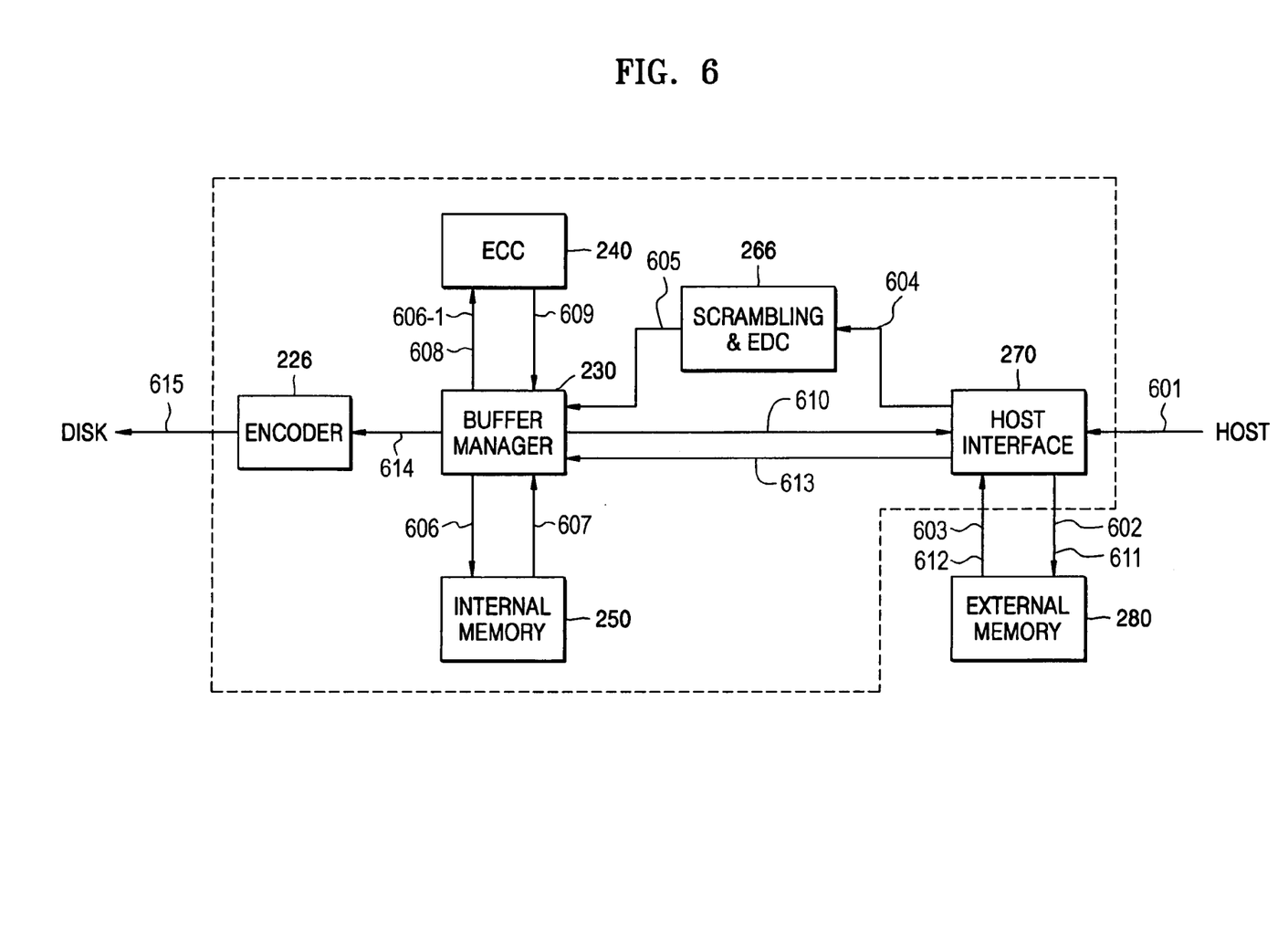
FIG. 6 is a block diagram illustrating a recording method according to an example embodiment of the present invention.

FIG. 6 is a block diagram illustrating a method of recording data on a storage medium according to the present invention. In FIG. 6, the sequential flow of data is represented by arrows and associated reference characters.

Data received from a host 290, as shown in FIG. 2, is stored in an external memory 280, via a host interface 270, in operations 601 and 602. Data stored in the external memory 280 has the data format shown in FIG. 5B, except that the data has not yet been scrambled and EDC data has not yet been inserted.

A scrambling and EDC unit 266 receives data from the external memory 280 via the host interface 270, and performs scrambling and insertion of EDC in operations 603, 604 and 605. For ECC operation, the buffer manager 230 receives resulting scrambled and EDC-inserted data and transmits the scrambled and EDC-inserted data to the internal memory 250 and the ECC unit 240 in operations 606 and 606-1, respectively. Here, the buffer manager 230 uses the on-the-fly concept described above with reference to FIG. 4, so as to perform simultaneous data transmission to the ECC unit 240 and to the internal memory 250.

The ECC unit 240 performs PI and PO insertion while communicating with the internal memory 250 via the buffer manager 230 through operations 607, 608 and 609. One ECC block into which the PI and PO are inserted may have a format as shown in FIG. 5A.

Data into which the PI and PO are inserted are stored in the external memory 280 via the host interface 270 in units of single ECC blocks, in operations 610 and 611. At this time, the host interface 270 obtains the PO of each sector stored in a separate area of the external memory 280 by interleaving each PO stored in the internal memory with the corresponding sector data so that the format of data in the external memory 280 corresponds to FIG. 5B. After interleaving the PO of each sector, the buffer manager 230 sends the interleaved data from the external memory 280 to an encoder 226 via the host interface 270 through operations 612, 613 and 614. The encoder 226 encodes the data and then records the encoded data on a storage medium in operation 615.

Figure 7:
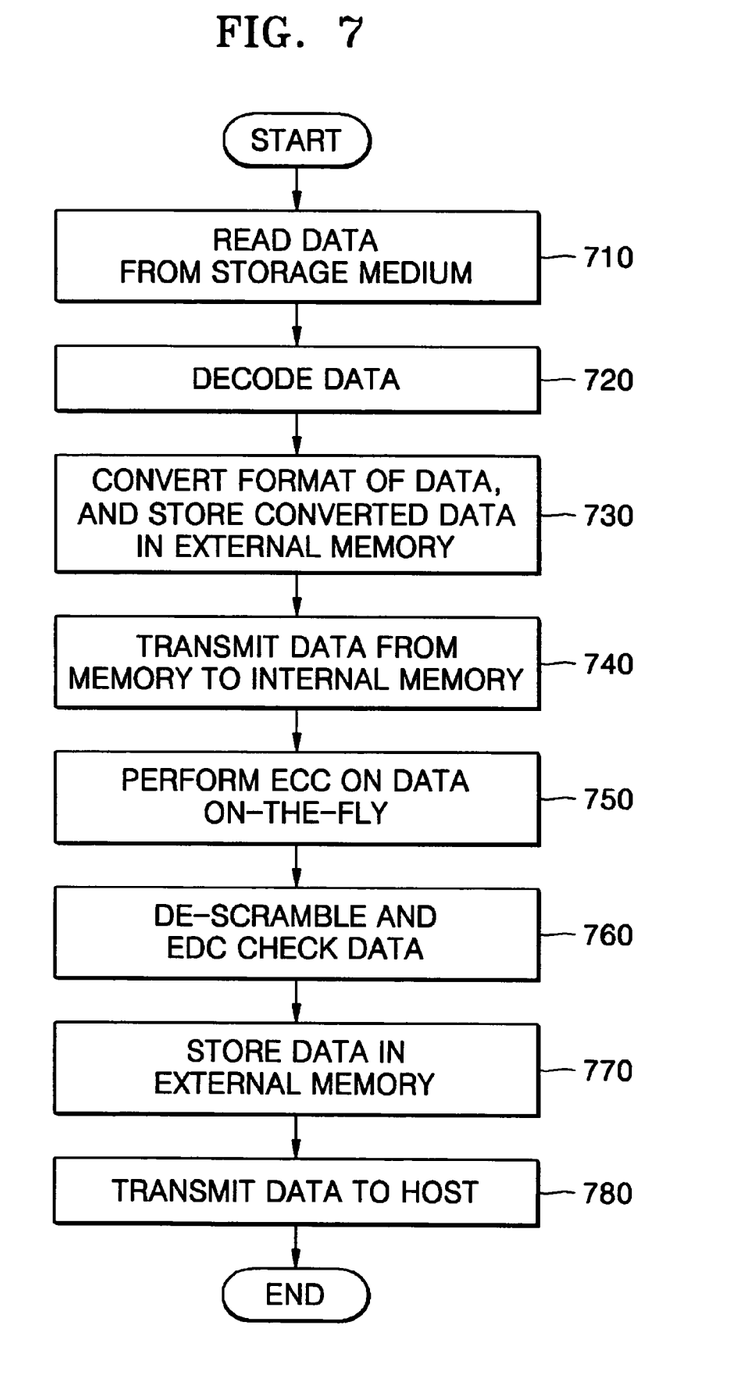
FIG. 7 is a flowchart illustrating a method of reproducing data from a storage medium, according to the present invention.

FIG. 7 is a flowchart illustrating a method of reproducing data from a storage medium according to the present invention.

Referring FIGS. 7 and 3, data is read from the storage medium in operation 710 and decoded by the decoder 224 in operation 720. The decoded data is stored in the external memory 280 via the host interface 270 in operation 730 according to the control of the buffer manager 230. Here, the host interface 270 converts the format of the decoded data into a format compatible with the external memory 280. De-interleaving is performed on PO information included in each sector of data in operation 730.

The buffer manager 230 reads data from the external memory 280 via the host interface 270 and stores the read data in the internal memory 250 in operation 740. Here, the host interface 270 converts the format of data stored in the external memory 280 into a format compatible with the internal memory 250. De-interleaving is performed on PO information included in each sector of data stored in the external memory 280 in operation 740.

The ECC unit 240 reads data from the internal memory 280 and performs ECC error correction on the data in operation 750. In performing the ECC error correction, PI, PI/PO, or PI/PO/PI/PO correction may be performed according to a predetermined DVD specification. Updating the result of the ECC error correction in the internal memory 250, and reading a new ECC block of data from the external memory 280 and storing the new ECC block of data in the internal memory 250, are performed at the same time within the duration of the first PI correction pulse (FIG. 4, 1st PI_WIN). The time taken to update the result of the ECC error correction in the internal memory 260 is 5 bytes long.

ECC error corrected data, the result of ECC error correction, is further subjected to de-scrambling and EDC checking in step 760, and then is stored in the external memory 280 in operation 770. Data stored in the external memory 280 is transmitted to a host 290, shown in FIG. 2, via the host interface 270 in operation 780.

Figure 8:
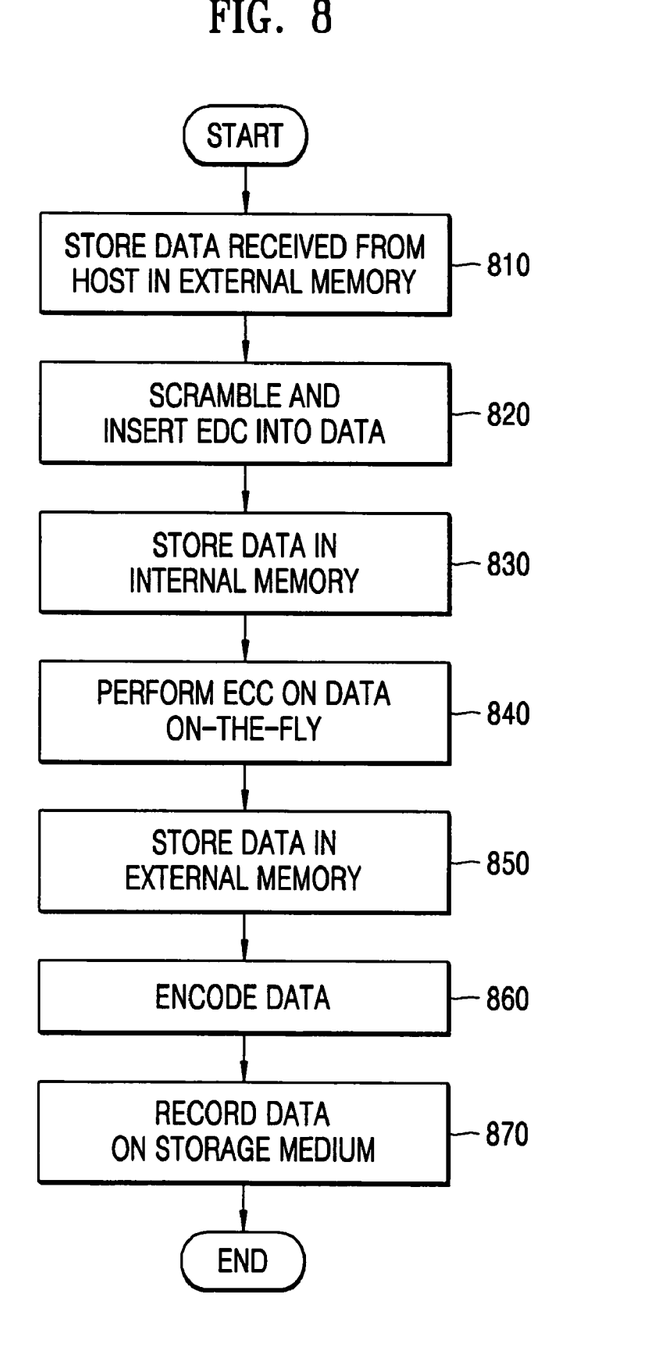
FIG. 8 is a flowchart illustrating a method of recording data on a storage medium, according to the present invention.

FIG. 8 is a flowchart illustrating a method of recording data on a storage medium, according to the present invention.

Referring to FIGS. 8 and 6, data received from a host 290, as shown in FIG. 2, is stored in an external memory 280 in operation 810. Data read from the external memory 280 via the host interface 270 is scrambled and then EDC information is inserted into the scrambled data in operation 820. Here, the host interface 270 converts the format of the data into the format compatible with the interval memory 250. De-interleaving PO information of data stored in the external memory 280 is performed in during the conversion.

The scrambled and EDC inserted data is stored in the internal memory 250 in operation 830. After that the scrambled and EDC inserted data is stored, the ECC unit 240 inserts ECC parity information into the scrambled and EDC inserted data, that is, PO and PI information are inserted into the data, in operation 840. Storing of the scrambled and EDC inserted data in the internal memory and performing ECC on the data are performed simultaneously within the duration of the first PI correction pulse (i.e., on-the-fly).

Data into which the ECC parity information is inserted is transferred from the internal memory 250 to the external memory 280 in operation 850. Here, the data is converted by the host interface 270 to have a format compatible with the external memory 280 and the conversion includes de-interleaving a PO by sectors.

Data stored in the external memory 280 is sent to the encoder 226 through the host interface 270 and the buffer manager 230 and is encoded by the encoder 226 in operation 880. The encoded data is recorded on the storage medium 110 in operation 870.

As described above, according to the present invention, the size of a memory of an apparatus for recording/reproducing data on a storage medium can be reduced, thereby increasing the manufacturing yield of a chip including the memory and reducing a chip test time. Further, reduction of the size of the memory may also enable reduction of the overall size of the apparatus.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of reproducing data from a storage medium in an apparatus provided with an internal memory and a host interface to interface a host and an external memory, the method comprising:

reading data including an error code correction (ECC) block from the storage medium, upon receipt of an instruction from the host, via host interface, storing the data in the external memory, via the host interface;

reading the error code correction (ECC) block of data from the external memory, via the host interface, and storing the ECC block of data read from the external memory in the internal memory having a data storage capacity of one ECC block of data for use in error code correction (ECC); and performing error code correction (ECC) on the ECC block of data stored in the internal memory.

2. The method of claim 1, further comprising:

performing de-scrambling and error detection correction (EDC) checking on ECC error corrected data.

3. The method of claim 2, further comprising:

storing de-scrambled and EDC checked data in the external memory, via the host interface.

4. The method of claim 3, wherein the performing of the error code correction (ECC) on the ECC block of data comprises:

updating the internal memory with the ECC error corrected data; and reading a new ECC block of data from the external memory and storing the new ECC block of data in the internal memory, wherein the updating and the storing of the new ECC black of data are performed simultaneously during a first inner parity (PI) correction period.

5. The method of claim 1, wherein the storing of the ECC block of data read from the external memory in the internal memory comprises:

converting a format of the ECC block of data read from the external memory to be compatible with the internal memory.

6. The method of claim 1, wherein:

the ECC block of data is stored in the external memory in sectors, each sector data having an outer parity (PO) interleaved with the data; and the storing of the ECC block data read from the external memory in the internal memory comprises:

de-interleaving each PO before storing read data in the internal memory.

7. The method of claim 1, wherein the ECC block of data read from the external memory comprises:

simultaneously buffering one ECC block of the data read from the external memory to the internal memory and an ECC corrector;

performing error code correction (ECC) of the one ECC block of the data buffered to the ECC corrector in stages; and continuously updating data buffered to the internal memory with the ECC corrected data in corresponding stages.

8. The method of claim 7, wherein the error code correction (ECC) of the one ECC block of the data comprises:

generating an ECC start pulse and an ECC end pulse which define one ECC period;

generating a correction window beginning at the ECC start pulse and ending before the ECC end pulse;

generating inner parity correction during the correction window; and generating outer parity correction in an interval between an end of the correction window and the ECC end pulse.

9. The method of claim 8, further comprising:

generating first and second buffering control pulses during the correction window;

controlling data transmission among the external memory, the internal memory and the ECC corrector during the first control pulse; and controlling data transmission of error corrected data from the ECC corrector to the internal memory during the second control pulse.

10. The method of claim 9, further comprising:

storing and updating a single codeword during a combined duration of the first and second buffering control pulses.

11. A method of recording data on a storage medium in an apparatus provided with an internal memory and a host interface to interface a host and an external memory, the method comprising:

storing data received from the host in the external memory, via the host interface, in response to an instruction from the host to record data on the storage medium;

reading data stored in the external memory, and scrambling and inserting error detection code (EDC) information into data;

storing scrambled and EDC inserted data the an internal memory having a data storing capacity of one ECC block of data for use in error code correction (ECC), and inserting ECC parity information into the scrambled and EDC inserted data for error correction (ECC);

transferring data into which ECC parity information is inserted from the internal memory to the external memory; and reading again data stored in the external memory for recording on the storage medium.

12. The method of claim 11, wherein the inserting of the ECC parity information comprises:

generating a first inner parity (PI); and generating a first outer parity (PO).

13. The method of claim 11, wherein the generating of the first PI comprises:
updating the internal memory with PI-inserted data; and
receiving new data from the external memory and storing the new data in the internal memory,
wherein the updating and the storing are performed simultaneously while the first PI is generated.

14. The method of claim 11,
wherein data read from the external memory again for recording is encoded, and encoded data is recorded on the storage medium.

15. The method of claim 11, wherein data read from one of the internal memory and the external memory is converted to a format compatible with the other one of the internal memory and the external memory prior to storage in the other one of the internal memory and the external memory.

16. The method of claim 11, wherein:
the method further comprises generating an outer parity (PO) corresponding to each sector of the data to be stored in the external memory;
the storing of the data read from the internal memory in the external memory comprises:
interleaving each PO with the corresponding sector of the data before storing the data into the external memory; and
the storing of the data read from the external memory in the internal memory comprises:
de-interleaving each PO before storing the data into the internal memory.

17. An apparatus for reproducing data from a storage medium, comprising:
a decoder which decodes data read from the storage medium;
a host interface arranged to interface with the external memory;
an ECC corrector;
an internal memory having a data storage capacity of only one ECC block of data for use in error code correction (ECC) by the ECC corrector; and
a buffer manager which:
controls the storage of data read from the storage memory in the external memory, via the host interface;
simultaneously routes one ECC block of data read from the external memory to the ECC corrector and to the internal memory, via the host interface; and
updates the internal memory with error corrected data from the ECC corrector in stages.

18. The apparatus of claim 17, wherein the host interface converts a format for the data read from the external memory to a format compatible with the internal memory.

19. An apparatus for reproducing data from a storage medium, comprising:
a decoder arranged to decode data read from the storage medium;
an external memory to temporarily store read data from the decoder in sectors;
a host interface;
an error correction code (ECC) corrector;
an internal memory having a data storage capacity of only one ECC block of data; and
a buffer manager arranged to control storage of the read data in the external memory, via the host interface, to simultaneously route only one ECC block of data read from the external memory to the ECC corrector and the internal memory, via the host interface, and to update the internal memory with error corrected data from the ECC corrector in stages,
wherein, during updating, the buffer manager further:
generates an ECC start pulse and an ECC end pulse which define one ECC period;
generates a correction window beginning at the ECC start pulse and ending before the ECC end pulse.
generates inner parity correction during the correction window; and
generates outer parity correction in an interval between an end of the correction window and the ECC end pulse.

20. The apparatus of claim 19, wherein the buffer manager:
generates first and second buffering control pulses during the correction window;
controls data transmission among the external memory, the internal memory and the ECC corrector during the first control pulse; and
controls data transmission of error corrected data from the ECC corrector to the internal memory during the second control pulse.

21. The apparatus of claim 19, wherein the buffer manager:
updates a single codeword in the internal memory during a combined duration of the first and second buffering control pulses.

22. The apparatus of claim 19, wherein the internal memory comprises capacity for storing a predetermined number of codewords, in which read data is stored in the capacity allocated for some of the predetermined number of codewords and outer parties for each of a plurality of groups of the predetermined number of codewords are sequentially stored in capacity allocated for a remainder of the codewords.

23. The apparatus of claim 19, wherein the external memory stores data in groups of a predetermined number of codewords, each group of codewords being stored with an outer parity.

* * * * *

UNITED STATES PATENT AND TRADEMARK OFFICE
CERTIFICATE OF CORRECTION

| | | |
|---|---|---|
| PATENT NO. | : 7,308,639 B2 | Page 1 of 1 |
| APPLICATION NO. | : 10/992699 | |
| DATED | : December 11, 2007 | |
| INVENTOR(S) | : Hyun-jeong Park et al. | |

It is certified that error appears in the above-identified patent and that said Letters Patent is hereby corrected as shown below:

Column 9, line 51, change "black" to --block--.

Column 9, line 64, delete ":".

Column 10, line 51, insert --read-- before "data".

Column 10, line 52, insert --in-- after "data".

Column 10, line 56, insert --code-- after "error".

Column 11, line 33, insert --for storage in an external memory-- after "medium".

Column 12, line 22, change "." to --;--.

Signed and Sealed this

Tenth Day of June, 2008

JON W. DUDAS
*Director of the United States Patent and Trademark Office*